US009429769B2

(12) United States Patent
Pugh et al.

(10) Patent No.: US 9,429,769 B2
(45) Date of Patent: Aug. 30, 2016

(54) OPHTHALMIC DEVICE WITH THIN FILM NANOCRYSTAL INTEGRATED CIRCUITS

(71) Applicant: Johnson & Johnson Vision Care, Inc., Jacksonville, FL (US)

(72) Inventors: Randall B. Pugh, Jacksonville, FL (US); Frederick A. Flitsch, New Windsor, NY (US)

(73) Assignee: Johnson & Johnson Vision Care, Inc., Jacksonville, FL (US)

( * ) Notice: Subject to any disclaimer, the term of this patent is extended or adjusted under 35 U.S.C. 154(b) by 127 days.

(21) Appl. No.: 13/891,166

(22) Filed: May 9, 2013

(65) Prior Publication Data

US 2014/0333892 A1 Nov. 13, 2014

(51) Int. Cl.
*G02C 7/00* (2006.01)
*G02C 7/02* (2006.01)
*G02C 7/04* (2006.01)
*G02C 7/06* (2006.01)
*B29D 11/00* (2006.01)
*G02C 7/08* (2006.01)
*H01L 23/58* (2006.01)
*H01L 25/065* (2006.01)

(52) U.S. Cl.
CPC ........... *G02C 7/04* (2013.01); *B29D 11/00817* (2013.01); *G02C 7/081* (2013.01); *H01L 23/58* (2013.01); *H01L 25/0657* (2013.01); *H01L 2924/0002* (2013.01)

(58) Field of Classification Search
CPC ............ G02C 7/02; G02C 7/06; G02C 7/04; G02C 7/083; G02C 7/085; G02C 7/101; G02C 2202/04; G02F 1/29; G02F 1/1333; H01L 31/048; A61B 5/6821; A61B 5/14507; A61B 5/14532; A61F 2/14; A61F 2/16; A61F 2/1624; G02B 3/14
USPC .................. 351/159, 165, 168, 159.34, 158, 351/159.01, 159.64, 159.73; 438/674; 349/13; 359/665, 666; 623/4.1, 6.22
See application file for complete search history.

(56) References Cited

U.S. PATENT DOCUMENTS

| | | | | |
|---|---|---|---|---|
| 5,737,126 A * | 4/1998 | Lawandy | ...................... | 359/620 |
| 6,713,389 B2 * | 3/2004 | Speakman | ..................... | 438/674 |
| 6,885,818 B2 * | 4/2005 | Goldstein | ....................... | 396/59 |
| 6,935,743 B2 * | 8/2005 | Shadduck | ............... | 351/159.04 |
| 7,085,065 B2 * | 8/2006 | Silver | ........................... | 359/666 |
| 7,129,166 B2 * | 10/2006 | Speakman | .................... | 438/674 |
| 7,557,367 B2 | 7/2009 | Rogers et al. | | |
| 8,372,726 B2 * | 2/2013 | de Graff et al. | ............. | 438/457 |

(Continued)

OTHER PUBLICATIONS

Kolb, Dan. Pentacene-based organic transistors. School of Engineering, University of Durham, Oct. 2005.*
Dong Yu, Congjun Wang, Philippe Guyot-Sionnest. n-Type Conducting CdSe Nanocrystal Solids. Science vol. 300 May 23, 2003.*

(Continued)

*Primary Examiner* — Bumsuk Won
*Assistant Examiner* — Collin X Beatty

(57) ABSTRACT

This invention discloses methods and apparatus to form Thin Film Nanocrystal Integrated Circuit transistors upon Three-dimensionally Formed Insert Pieces. In some embodiments, the present invention includes incorporating the Three-dimensional Surfaces with Thin Film Nanocrystal Integrated Circuit based thin film transistors, electrical interconnects, and energization elements into an Insert Piece for incorporation into Ophthalmic Device. In some embodiments, the Insert Piece may be directly used as a Media Insert or incorporated into an Ophthalmic Device.

39 Claims, 6 Drawing Sheets

(56) References Cited

U.S. PATENT DOCUMENTS

| | | | |
|---|---|---|---|
| 2003/0086135 A1* | 5/2003 | Takeyama | 359/13 |
| 2005/0280769 A1* | 12/2005 | Cano et al. | 351/41 |
| 2009/0015785 A1* | 1/2009 | Blum et al. | 351/159 |
| 2009/0033863 A1* | 2/2009 | Blum et al. | 351/160 R |
| 2009/0204207 A1* | 8/2009 | Blum et al. | 623/4.1 |
| 2009/0257277 A1 | 10/2009 | Kim | |
| 2009/0279050 A1* | 11/2009 | McGinn et al. | 351/168 |
| 2010/0076553 A1 | 3/2010 | Pugh et al. | |
| 2010/0104476 A1* | 4/2010 | Ibanez et al. | 422/82.08 |
| 2011/0013136 A1* | 1/2011 | Archambeau et al. | 351/159 |
| 2011/0015512 A1* | 1/2011 | Pan et al. | 600/399 |
| 2011/0028807 A1* | 2/2011 | Abreu | 600/321 |
| 2011/0102738 A1* | 5/2011 | Gupta et al. | 351/168 |
| 2012/0044574 A1 | 2/2012 | Pugh et al. | |
| 2012/0140167 A1* | 6/2012 | Blum | 351/159.34 |
| 2012/0235277 A1 | 9/2012 | Pugh et al. | |
| 2012/0268712 A1* | 10/2012 | Egan et al. | 351/159.34 |
| 2013/0041245 A1* | 2/2013 | Cerboni | 600/398 |
| 2013/0050639 A1 | 2/2013 | Trajkovska et al. | |
| 2013/0150689 A1* | 6/2013 | Shaw-Klein | 600/345 |
| 2014/0148899 A1* | 5/2014 | Fehr et al. | 623/6.22 |

OTHER PUBLICATIONS

Yi Liu, Qingfeng Dong, Haotong Wei, Yang Ning, Haizhu Sun, Wenjing Tian, Hao Zhang, and Bai Yang. Synthesis of $Cu_2$—xSe Nanocrystals by Tuning the Reactivity of Se. J. Phys. Chem. C 2011, 115, 9909-9916. dx.doi.org/10.1021/jp2008732.*

Lori E. Greene, Benjamin D. Yuhas, Matt Law, David Zitoun, and Peidong Yang. Solution-Grown Zinc Oxide Nanowires. Inorganic Chemistry, vol. 45, No. 19, 2006.*

Zachary C. Holman, Chin-Yi Liu, and Uwe R. Kortshagen. Germanium and Silicon Nanocrystal Thin-Film Field-Effect Transistors from Solution. DOI: 10.1021/nl101413d | Nano Lett. 2010, 10.*

David K. Kim, Yuming Lai, Benjamin T. Diroll, Christopher B. Murray, and Cherie R. Kagan. Flexible and low-voltage integrated circuits constructed from high-performance nanocrystal transistors. Nature Communications, 3:1216, DOI: 10.1038/ncomms2218. 2012 Macmillan Publishers Limited.*

PCT International Search Report for PCT/US2014/037335 Dated: Sep. 9, 2014.

David K. Kim et al: "Flexible and low-voltage integrated circuits constructed from high-performance nanocrystal transistors", Nature Communications, vol. 3, Nov. 20, 2012, p. 1216, XP055137636, DOI: 10.1038/ncomms2218 the whole document.

* cited by examiner

US 9,429,769 B2

OPHTHALMIC DEVICE WITH THIN FILM NANOCRYSTAL INTEGRATED CIRCUITS

FIELD OF USE

This invention describes methods and apparatus operant to form a device wherein thin film nanocrystal transistors and integrated circuit devices are defined upon Ophthalmic Device insert components. In some embodiments, the methods and apparatus to form Thin Film Nanocrystal Integrated Circuit devices within Ophthalmic Devices relate to said formation upon surfaces that occur on substrates that have three-dimensional shapes. In some embodiments, a field of use for the methods and apparatus may include Ophthalmic Devices, which incorporate energization elements, inserts and Thin Film Nanocrystal Integrated Circuit devices.

BACKGROUND

Traditionally, an Ophthalmic Device, such as a contact lens, an intraocular lens, or a punctal plug included a biocompatible device with a corrective, cosmetic, or therapeutic quality. A contact lens, for example, may provide one or more of vision correcting functionality, cosmetic enhancement, and therapeutic effects. Each function is provided by a physical characteristic of the lens. A design incorporating a refractive quality into a lens may provide a vision corrective function. A pigment incorporated into the lens may provide a cosmetic enhancement. An active agent incorporated into a lens may provide a therapeutic functionality. Such physical characteristics are accomplished without the lens entering into an energized state. A punctal plug has traditionally been a passive device.

More recently, active components have been incorporated into a contact lens. Some components may include semiconductor devices. Some examples have shown semiconductor devices embedded in a contact lens placed upon animal eyes. It has also been described how the active components may be energized and activated in numerous manners within the lens structure itself. The topology and size of the space defined by the lens structure creates a novel and challenging environment for the definition of various functionalities. In many embodiments, it is important to provide reliable, compact and cost effective means to energize components within an Ophthalmic Device. In some embodiments, these energization elements may include batteries, which may also be formed from "alkaline" cell based chemistry. Connected to these energization elements may be other components that utilize their electrical energy. In some embodiments, these other components may include transistors to perform circuit functions. It may be useful and enabling to include in such devices Thin Film Nanocrystal Integrated Circuit devices.

SUMMARY

Accordingly, the present invention includes an active Ophthalmic Device comprising a first Three-dimensionally Formed Media Insert, wherein the first Media Insert comprises a first energization element proximate to a first conductive trace, wherein the proximity may be capable of placing the first energization element in electrical communication with a first thin film transistor comprising a first thin film nanocrystal transistor device layer; and a hydrogel material, wherein the hydrogel material may be capable of surrounding or encapsulating the first Media Insert.

In some embodiments, the first conductive trace may comprise a transparent electrode including, for example, indium tin oxide. The first energization element may comprise a plurality of electrochemical cells, wherein the electrochemical cells may be connected, at least in part, in a series. The first thin film transistor may comprise an n-type nanocrystal layer, including, for example, Cadmium Selenide (CdSe) nanocrystals. Alternatively, the first thin film transistor may comprise a p-type nanocrystal layer, including, for example, Copper Selenide.

The Media Insert encapsulated in the Ophthalmic Device may further comprise a second thin film transistor comprising a second nanocrystal layer, wherein the second thin film transistor may be in electrical communication with the first energization element. Similar to the first thin film transistor, in some embodiments, the second nanocrystal layer may comprise p-type nanocrystal layer, including, for example, Copper Selenide.

In some embodiments, the Ophthalmic Device may further comprise an active optical device capable of changing the focal characteristics of the Ophthalmic Device, wherein the active optical device may be in electrical communication with the first energization element. For example, the active optical device may comprise a liquid meniscus lens element. In some such embodiments, the Media Insert encapsulated in the Ophthalmic Device may further include an activation element in electrical communication with the active optical device, such as, for example, a pressure-sensitive switch.

The present invention also includes second Media Insert comprising a second energization element; a second conductive trace; and a third thin film transistor comprising an organic semiconductor layer, wherein the second conductive trace is capable of placing the second energization element in electrical communication with the third film transistor. The third film transistor may comprise the n-type nanocrystal layer, including, for example Cadmium Selenide nanocrystals. The second Media Insert may further comprise a fourth thin film transistor layer, wherein the fourth thin film transistor layer comprises the p-type organic semiconductor layer, such as, for example, pentacene.

DESCRIPTION OF THE DRAWINGS

FIG. 6 illustrates a representation of an Insert Piece comprising the circuit elements of

DETAILED DESCRIPTION OF THE INVENTION

Figure 1:
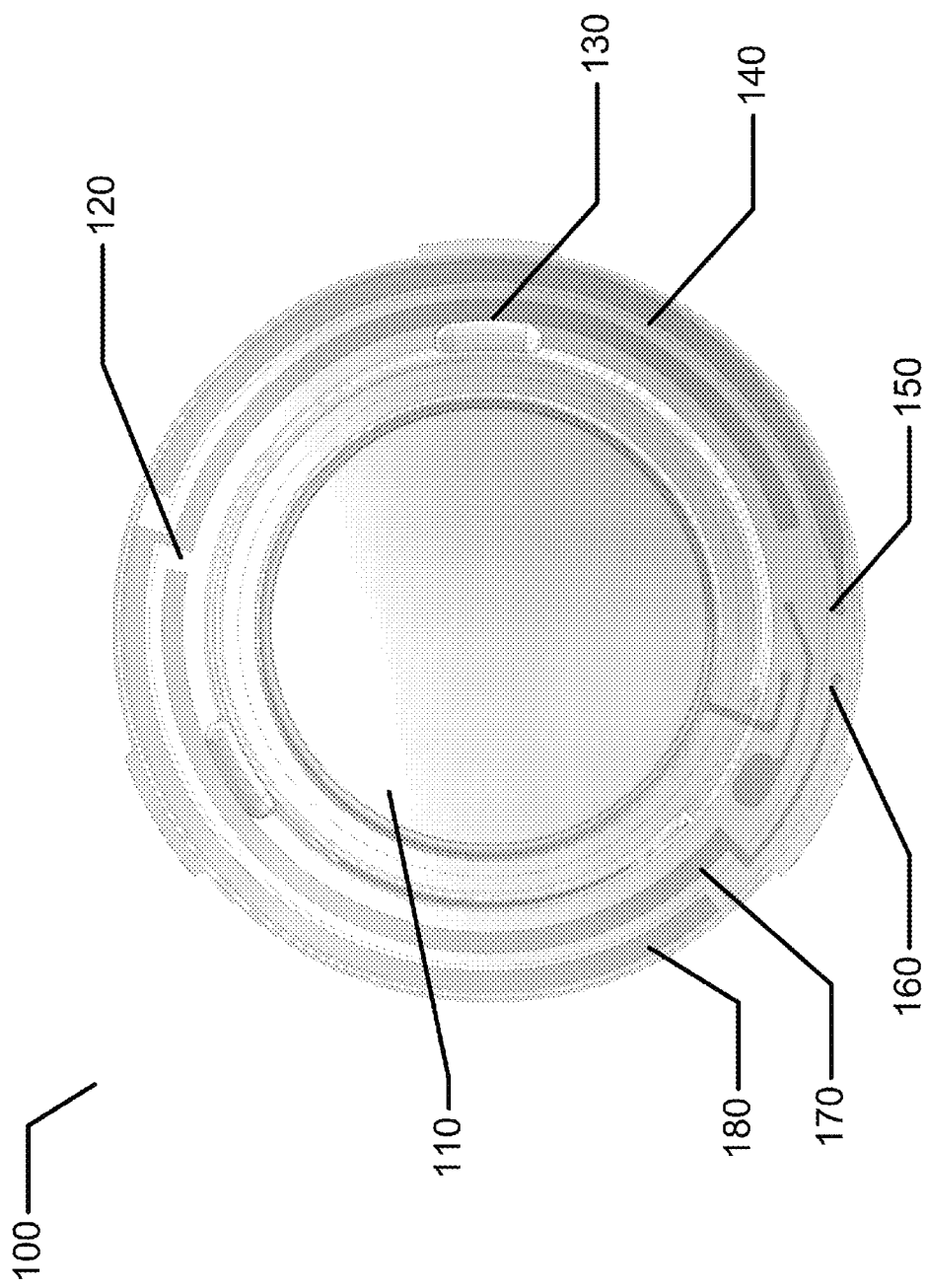
FIG. 1 illustrates an exemplary Insert Piece with Three-dimensional Surfaces upon which Thin Film Nanocrystal Integrated Circuit devices may be defined consistent with other related disclosures of the inventive entity.

The present invention relates to Ophthalmic Devices including Thin Film Nanocrystal Integrated Circuit devices.

In some embodiments the Thin Film Nanocrystal Integrated Circuit devices are attached to one or more Media Inserts. In some embodiments, the Media Insert structure may have surfaces that have three-dimensional topology.

Some embodiments may also include thin film nanocrystal transistors and integrated circuits consistent with flexible substrates. Some specific devices include cadmium selenide as short chain inorganic based ligands, such as thiocyanate materials. Nanocrystals may be coordinated into useable and conductive layers.

In the following sections detailed descriptions of embodiments of the invention will be given. The description of both preferred and alternative embodiments are exemplary embodiments only, and it is understood that to those skilled in the art that variations, modifications and alterations may be apparent. It is therefore to be understood that said exemplary embodiments do not limit the scope of the underlying invention.

GLOSSARY

In this description and claims directed to the presented invention, various terms may be used for which the following definitions will apply:

Anode: as used herein refers to an Electrode through which electric current flows into a polarized electrical device. The direction of electric current that is typically opposite to the direction of electron flow. In other words, the electrons flow from the Anode into, for example, an electrical circuit.

Cathode: as used herein refers to an Electrode through which electric current flows out of a polarized electrical device. The direction of electric current that is typically opposite to the direction of electron flow. Therefore, the electrons flow into the polarized electrical device and out of, for example, the connected electrical circuit.

Electrode: as used herein can refer to an active mass in the Energy Source. For example, it may include one or both of the Anode and Cathode.

Encapsulate: as used herein refers to creating a barrier to separate an entity, such as, for example, a Media Insert, from an environment adjacent to the entity.

Encapsulant: as used herein refers to a layer formed surrounding an entity, such as, for example, a Media Insert, that creates a barrier to separate the entity from an environment adjacent to the entity. For example, Encapsulants may be comprised of silicone hydrogels, such as Etafilcon, Galyfilcon, Narafilcon, and Senofilcon, or other hydrogel contact lens material. In some embodiments, an Encapsulant may be semipermeable to contain specified substances within the entity and preventing specified substances, such as, for example, water, from entering the entity.

Energized: as used herein refers to the state of being able to supply electrical current to or to have electrical energy stored within.

Energy: as used herein refers to the capacity of a physical system to do work. Many uses within this invention may relate to the said capacity being able to perform electrical actions in doing work.

Energy Source: as used herein refers to device or layer which is capable of supplying Energy or placing a logical or electrical device in an Energized state.

Energy Harvesters: as used herein refers to device capable of extracting energy from the environment and convert it to electrical energy.

Functionalized: as used herein refers to making a layer or device able to perform a function including for example, energization, activation, or control.

Insert Piece: as used herein refers to a solid element of a multi-piece Rigid Insert or Media Insert that may be assembled into the Rigid Insert or Media Insert. In an Ophthalmic Device, an Insert Piece may contain and include a region in the center of an Ophthalmic Device through which light may proceed into the user's eye. This region may be called an Optic Zone. In other embodiments, the piece may take an annular shape where it does not contain or include some or all of the regions in an Optical Zone. In some embodiments, a Rigid Insert or Media Insert may comprise multiple Inserts Pieces, wherein some Insert Pieces may include the Optic Zone and other Insert Pieces may be annular or portions of an annulus.

Lens forming mixture or Reactive Mixture or Reactive Monomer Mixture (RMM): as used herein refers to a monomer or prepolymer material, which may be cured and crosslinked or crosslinked to form an Ophthalmic Lens. Various embodiments may include lens-forming mixtures with one or more additives such as: UV blockers, tints, photoinitiators or catalysts, and other additives one might desire in an Ophthalmic Lenses such as, contact or intraocular lenses.

Lens Forming Surface: refers to a surface that is used to mold a lens. In some embodiments, any such surface 103-104 can have an optical quality surface finish, which indicates that it is sufficiently smooth and formed so that a lens surface fashioned by the polymerization of a lens forming material in contact with the molding surface is optically acceptable. Further, in some embodiments, the lens forming surface 103-104 can have a geometry that is necessary to impart to the lens surface the desired optical characteristics, including without limitation, spherical, aspherical and cylinder power, wave front aberration correction, corneal topography correction and the like as well as any combinations thereof.

Lithium Ion Cell: refers to an electrochemical cell where Lithium ions move through the cell to generate electrical energy. This electrochemical cell, typically called a battery, may be reenergized or recharged in its typical forms.

Substrate insert: as used herein refers to a formable or rigid substrate capable of supporting an Energy Source within an Ophthalmic Lens. In some embodiments, the Substrate insert also supports one or more components.

Media Insert: as used herein refers to an encapsulated insert that will be included in an energized Ophthalmic Device. The energization elements and circuitry may be embedded in the Media Insert. The Media Insert defines the primary purpose of the energized Ophthalmic Device. For example, in embodiments where the energized Ophthalmic Device allows the user to adjust the optic power, the Media Insert may include energization elements that control a liquid meniscus portion in the Optical Zone. Alternatively, a Media Insert may be annular so that the Optical Zone is void of material. In such embodiments, the energized function of the Lens may not be optic quality but may be, for example, monitoring glucose or administering medicine.

Mold: refers to a rigid or semi-rigid object that may be used to form lenses from uncured formulations. Some preferred molds include two mold parts forming a front curve mold part and a back curve mold part.

Ophthalmic Lens or Ophthalmic Device or Lens: as used herein refers to any device that resides in or on the eye. The device may provide optical correction, may be cosmetic, or provide some functionality unrelated to optic quality. For example, the term Lens may refer to a contact Lens, intraocular Lens, overlay Lens, ocular insert, optical insert, or other similar device through which vision is corrected or modified, or through which eye physiology is cosmetically enhanced (e.g. iris color) without impeding vision. Alternatively, Lens may refer to a device that may be placed on the eye with a function other than vision correction, such as, for example, monitoring of a constituent of tear fluid or means of administering an active agent. In some embodiments, the preferred Lenses of the invention may be soft contact Lenses that are made from silicone elastomers or hydrogels, which may include, for example, silicone hydrogels and fluorohydrogels.

Optic Zone: as used herein refers to an area of an Ophthalmic Lens through which a wearer of the Ophthalmic Lens sees.

Power: as used herein refers to work done or energy transferred per unit of time.

Precure: as used herein refers to a process that partially cures a mixture, such as a Reactive Monomer Mixture. In some embodiments, a precuring process may comprise a shortened period of the full curing process. Alternatively, the precuring process may comprise a unique process, for example, by exposing the mixture to different temperatures and wavelengths of light than may be used to fully cure the material.

Predose: as used herein refers to the initial deposition of material in a quantity that is less than the full amount that may be necessary for the completion of the process. For example, a predose may include a quarter of the necessary substance, such as, for example, a Reactive Monomer Mixture.

Postdose: as used herein refers to a deposition of material in the remaining quantity after the predose that may be necessary for the completion of the process. For example, where the predose includes a quarter of the necessary substance, a subsequent postdose may provide the remaining three quarters of the substance, such as, for example, a Reactive Monomer Mixture.

Rechargeable or Re-energizable: as used herein refers to a capability of being restored to a state with higher capacity to do work. Many uses within this invention may relate to the capability of being restored with the ability to flow electrical current at a certain rate for a specified, reestablished time period.

Reenergize or Recharge: To restore to a state with higher capacity to do work. Many uses within this invention may relate to restoring a device to the capability to flow electrical current at a certain rate for a specified, reestablished time period.

Released from a mold: means that a lens is either completely separated from the mold, or is only loosely attached so that it may be removed with mild agitation or pushed off with a swab.

Stacked: as used herein means to place at least two component layers in proximity to each other such that at least a portion of one surface of one of the layers contacts a first surface of a second layer. In some embodiments, a film, whether for adhesion or other functions may reside between the two layers that are in contact with each other through said film.

Stacked Integrated Component Devices or SIC Devices: as used herein refers to the product of packaging technologies that assemble thin layers of substrates, which may contain electrical and electromechanical devices, into operative integrated devices by means of stacking at least a portion of each layer upon each other. The layers may comprise component devices of various types, materials, shapes, and sizes. Furthermore, the layers may be made of various device production technologies to fit and assume various contours.

Thin Film Nanocrystal Integrated Circuit: as used herein refers to a semiconductor that is made from carbon-based materials.

Three-dimensional Surface or Three-dimensional Substrate or Three-dimensionally Formed: as used herein refers to any surface or substrate that has been Three-dimensionally Formed where the topography is designed for a specific purpose, in contrast to a planar surface.

Trace: as used herein refers to a battery component capable of electrically connecting the circuit components. For example, circuit Traces may include copper or gold when the substrate is a printed circuit board and may be copper, gold, or printed Deposit in a flex circuit. Traces may also be comprised of nonmetallic materials, chemicals, or mixtures thereof.

Three-Dimensionally Formed Media Inserts with Incorporated Energization Devices for Inclusion of Thin Film Nanocrystal Integrated Circuit Devices.

The methods and apparatus related to the inventive art herein relate to forming Thin Film Nanocrystal Integrated Circuit devices within or on Three-dimensionally Formed substrates where the substrates also include electrical interconnects upon its surfaces. Proceeding to FIG. 1, an exemplary Three-dimensional Substrate 100 with electrical traces 130-180 is illustrated. In some embodiments, a Three-dimensional Substrate 100 may comprise a portion of an Insert Piece for an Ophthalmic Device. Some embodiments may include an Ophthalmic Device that incorporates an active focusing element. Such an active focusing device may function while utilizing energy that may be stored in an energization element. The traces 130-180 upon the Three-dimensional Substrate 100 may provide a substrate foundation for formation of energization elements. Discrete Thin Film Nanocrystal Integrated Circuit devices or circuits formed from Thin Film Nanocrystal Integrated Circuit devices may be connected to said traces 130-180 through various processes.

In Ophthalmic Device embodiments, the Three-dimensional Substrate may include an optically active region 110. For example, where the device is a focusing element, the region 110 may represent a front surface of an Insert Piece that contains the focusing element through which light passes on its way into a user's eye. Outside of this region 110, there may be a peripheral region of the Insert Piece that is not in an optically relevant path. In some embodiments, components related to the active focusing function may be placed in such peripheral region. In some embodiments, especially those utilizing very thin films and transparent electrodes, the components may be placed in this optically active region. For example, transparent electrodes may comprise indium tin oxide (ITO). The various components may be electrically connected to each other by metal traces, and some of these components may contain or may be Thin Film Nanocrystal Integrated Circuit devices. These metal traces may also provide a support function to the incorporation of energizing elements into the Ophthalmic Device.

In some embodiments, the energization element may be a battery. For example, the battery may be a solid-state battery or alternatively it may be a wet cell battery. In such embodiments, there may be a minimum of at least two traces that are electrically conductive to provide an electrical potential formed between the anode 150 of the battery and a cathode 160 of the battery to be provided to other active elements in the device for their energization. The anode 150 connection may represent the (−) potential connection of an energization element to incorporated devices. The cathode 160 connection may represent the (+) potential connection of an energization element to incorporated devices.

In some embodiments, Thin Film Nanocrystal Integrated Circuit elements may be connected through the anode 150 and cathode 160 connection points. In other embodiments, the Thin Film Nanocrystal Integrated Circuit devices may be formed directly upon the substrate 100 surface and may be connected with anode 150 and cathode 160 points or, alternatively, may be integrally connected by using the same metallurgy for interconnections within the circuit devices themselves.

The anode 150 and cathode 160 traces may be connected to isolated traces 140 and 170 respectively. These isolated traces 140 and 170 may lie close to neighboring traces 130 and 180. The neighboring traces 130 and 180 may represent the opposite battery chemistry or electrode type when battery elements are produced upon these traces 130 and 180. Thus, neighboring traces 130 and 180 may be connected to a chemical layer that may make it function as a cathode of a battery cell between traces 130 and 140.

The two neighboring traces 130 and 180 may connect to each other through a trace region 120. This region 120, in some embodiments, may not be covered by chemical layers, allowing the region to function as an electrical interconnection. In some exemplary embodiments, two pairs of electrical cells may be configured as batteries, and the nature of the layout and design may connect these two batteries in a series connection. The total electrical performance across connections 150 and 160 may be considered a combination of two battery cells. In embodiments that incorporate Thin Film Nanocrystal Integrated Circuit devices, the energization voltage requirements may be in the tens of volts. Accordingly, multiple regions 120 may be formed to allow the energization elements to define a higher total energization voltage.

Figure 2:
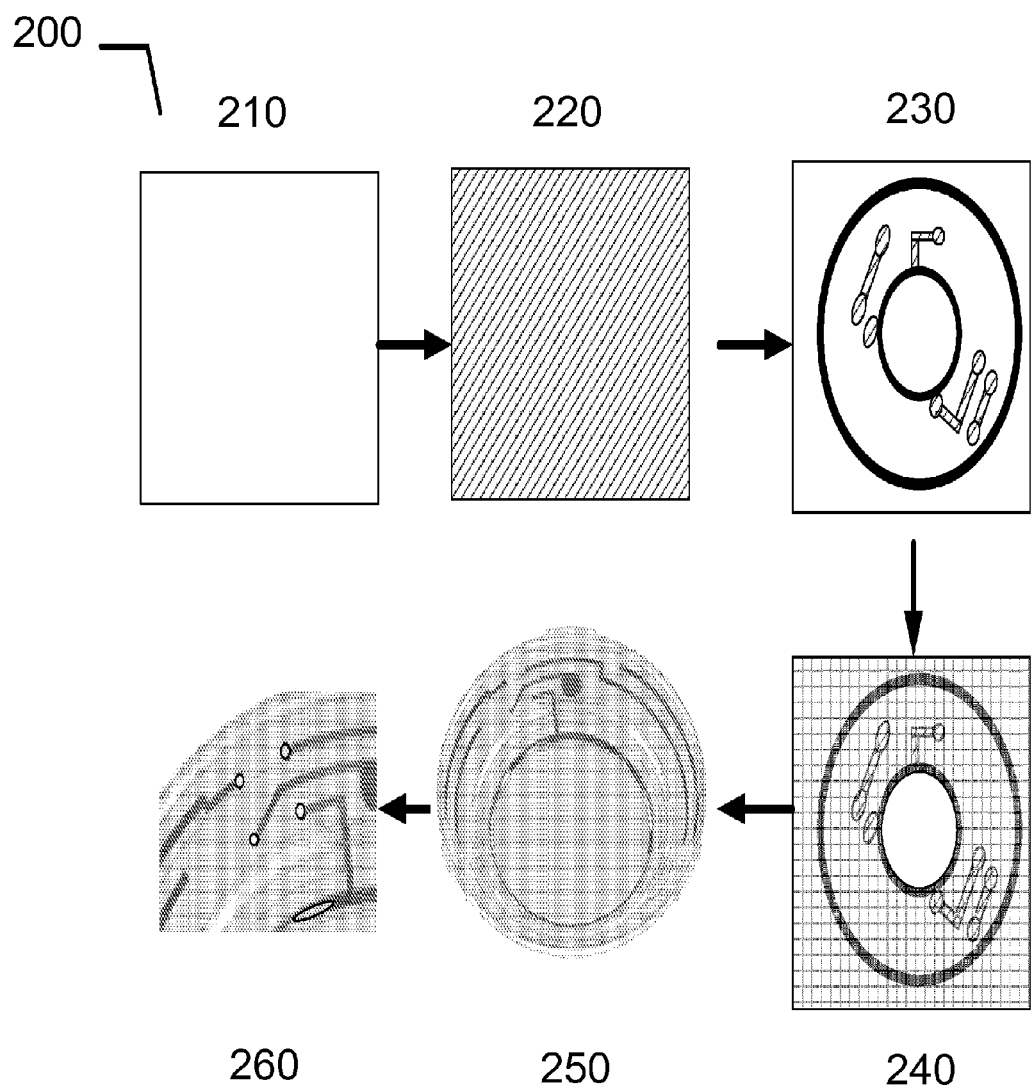
FIG. 2 illustrates an exemplary flow for forming Three-dimensional Surfaces that may be consistent with the formation of Thin Film Nanocrystal Integrated Circuit devices.

Proceeding to FIG. 2, an exemplary progression 200 for the formation of a Three-dimensional Substrate with conductive traces is illustrated. In some embodiments, a set of conductive features, which may after processing become interconnects on a Three-dimensional Surface, may be formed while base materials are kept in a planar shape. At 210, a base substrate may be formed. In ophthalmic embodiments, the substrate may be consistent with forming a part of an Ophthalmic Device. For example, the substrate may include Polyimide. In embodiments where the base substrate is formed from a conductive material, the surface may be coated with an insulator material, which may allow formation of interconnects on its surface. In some embodiments, where the substrate is comprised of polyimide, the substrate may be coated with an insulting layer, for example of aluminum oxide, which may provide the function of pre-shrinking the substrate before the thin film transistors are deposited or formed.

Figure 4:
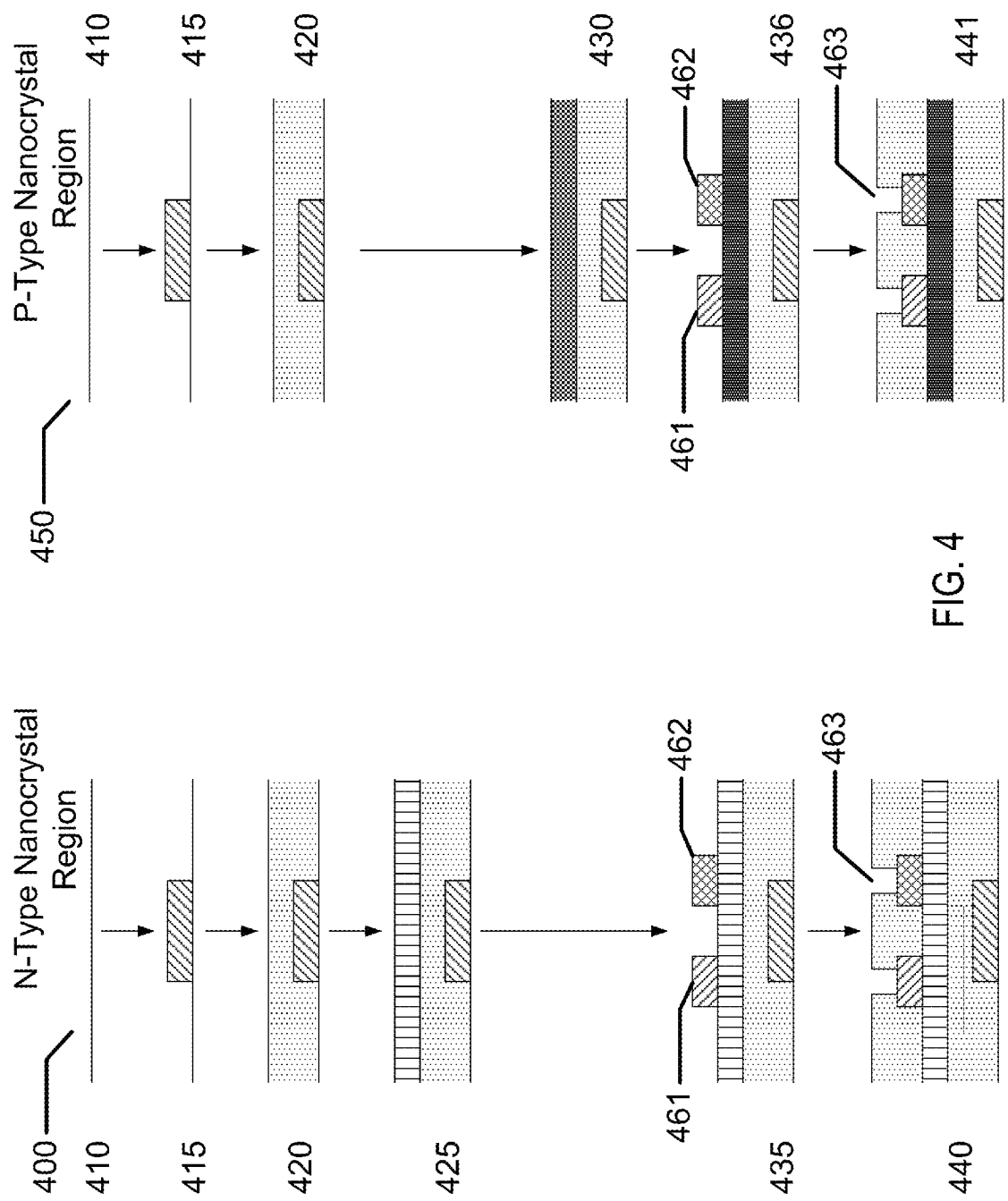
FIG. 4 illustrates an exemplary set of processing flow steps for the formation of complementary n and p-type Thin Film Nanocrystal Integrated Circuit devices, which may be useful for the inclusion into Ophthalmic Devices.

In some embodiments, the Thin Film Nanocrystal Integrated Circuit may be processed on the substrate obtained at 210. In some such embodiments, the nanocrystal processing steps, for example, as illustrated in FIG. 4, may have occurred prior to the substrate processing steps, as illustrated in FIG. 2. Accordingly, the substrate formed at 210 may include Thin Film Nanocrystal Integrated Circuit devices upon its surface. In other embodiments, the Thin Film Nanocrystal Integrated Circuit devices may be formed separately and may be connected to the conductive traces after the substrate has been processed at 260.

At 220, a conductive film may be applied to the substrate base. The conductive film may include, for example, an aluminum film. In some embodiments, the conductive film may be deformed where the flat substrate base may be Three-dimensionally Formed, and the conductive film may comprise a malleable conductive material of sufficient thickness to avoid mechanical failure during the three-dimensional forming processes.

At 230, the conductive film may be patterned into a shape that may form a predefined shape after the flat substrate is Three-dimensionally Formed. The shapes formed at 230 are for illustrative purposes only and other formations may be apparent. The conductive film, such as, for example, aluminum film, may be patterned through a variety of methods, for example, through photolithography with chemical etching or laser ablation. Alternatively, the imaged conductor patterns may have been deposited through a screen directly into the patterned shape. In embodiments where the Thin Film Nanocrystal Integrated Circuit devices are included on the substrate, the patterned shape formed at 230 may connect to the Thin Film Nanocrystal Integrated Circuit.

At 240, in some embodiments, the stacked layer comprising the base substrate with overlaid conductive features may be encapsulated in an overlaid material. In some embodiments, the overlaid material may comprise a thermoformable material, such as, for example, polyethylene terephtalate glycol (PETG). In some embodiments, or more specifically, where the stacked layer may be thermoformed, the encapsulation at 240 of the formed features may provide stability during thermoforming processes to create Three-dimensional Shapes. In some embodiments, a first planar thermoforming process may occur at 240 to seal the stacked layer, which may adhere the overlaid insulating material to the underlying substrate base and defined features in the conductive film. In some embodiments, a composite film may adversely affect the central optic region, and the central optic zone region of the stacked layer may be removed.

At 250, the stacked layer comprising the base material, formed conductive features, and overlaid encapsulating and insulating layer may be subjected to a thermoforming process, wherein the stacked layer may be Three-dimensionally Formed. In some embodiments, at 260, where the stacked layer is coated with an insulating layer, vias may be formed at 260 into the insulating material. At 260, the electrical conductive vias and openings may be included at appropriate locations, wherein the vias may allow the Thin Film Nanocrystal Integrated Circuit to connect with the encapsulated conductive features included on the stacked layer. The vias and openings may be formed through a variety of processes, including, for example, laser ablation, which may precisely create openings by ablating the top insulator layer of the stacked layer, thereby exposing an underlying conductive film area.

Figure 3:
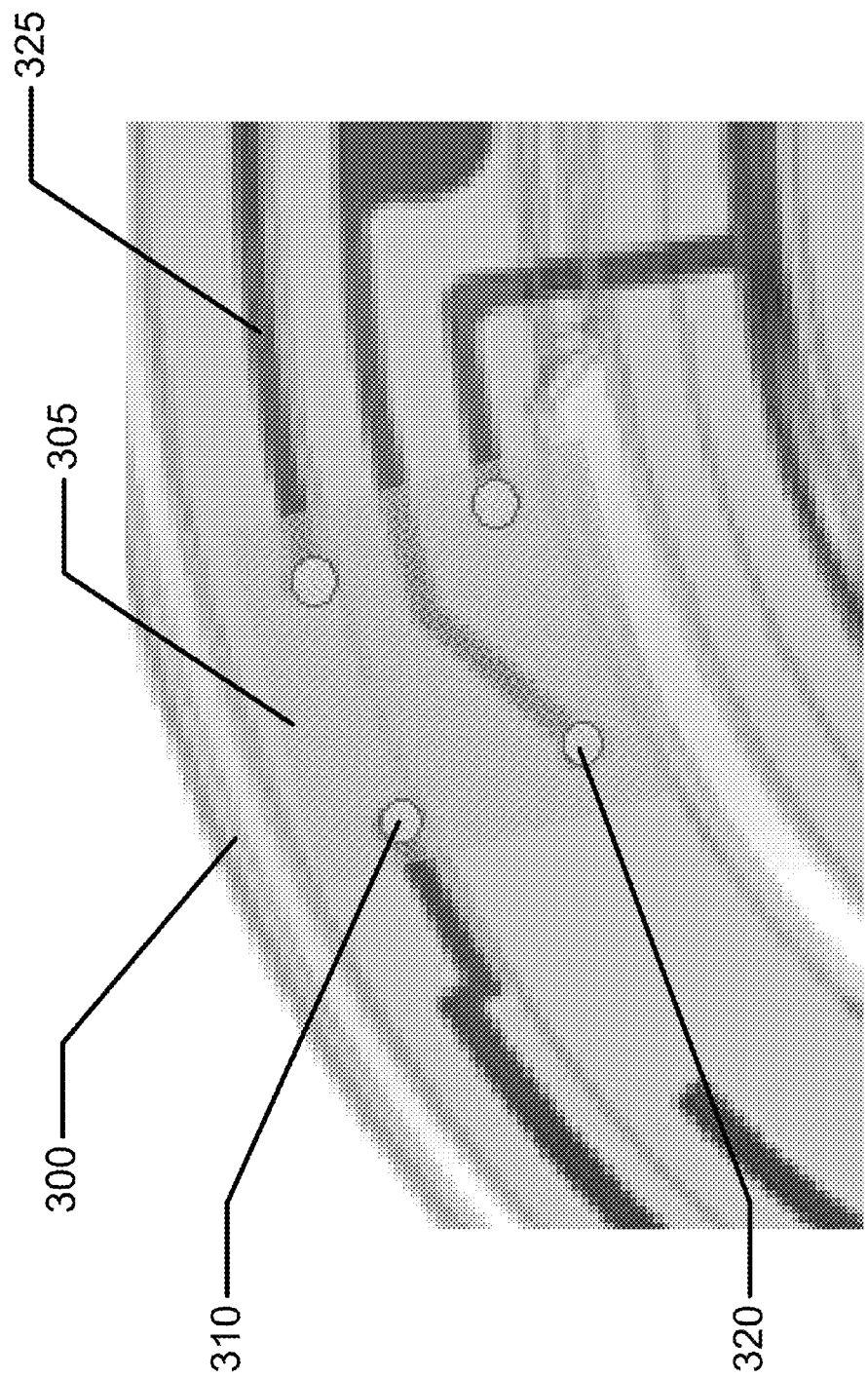
FIG. 3 illustrates an integrated circuit device connected to a Three-dimensionally Formed Insert Piece with conductive traces in at least two electrically conductive locations.

Electrically Connecting Thin Film Nanocrystal Integrated Circuit Devices Upon Three-Dimensionally Formed or Formable Insert Substrates Proceeding to FIG. 3, an exemplary embodiment of a Thin Film Nanocrystal Integrated Circuit 305 included on a Three-dimensionally Formed stacked layer comprising a substrate 300 with conductive traces 325 is illustrated. In some such embodiments, the Thin Film Nanocrystal Integrated Circuit 305 may be attached after the conductive traces 325 have been included on the substrate 300. Alternatively, the Thin Film Nanocrystal Integrated Circuit 305 may be included on the substrate 300 prior to placement of the conductive traces 325.

The components of the Thin Film Nanocrystal Integrated Circuit 305 may be electrically connected to the conductive traces 325 through interconnection features 310, 320 included on the substrate 300. The electrical connection at the interconnection features 310, 320 may connect the Thin Film Nanocrystal Integrated Circuit 305 to the electric components on the substrate 300 that may be critical for the functional operation of the Media Insert. Such electric components may include, for example, the energization elements, sensors, active optical elements, other integrated circuit designs, medicament pumps, and medicament dispersal devices. In some embodiments, including flip-chip orientations, interconnection features 310, 320 may comprise, for example, flowable solder balls or conductive epoxy. In embodiments where the conductive traces 325 and the interconnection features 310, 320 are encapsulated or insulated, vias may be cut out or diced from the stacked layer, which may allow connection between the components of the Thin Film Nanocrystal Integrated Circuit 305 and the interconnection features 310, 320.

Forming Thin Film Nanocrystal Integrated Circuit Transistors on Media Insert Surfaces Thin Film Nanocrystal Integrated Circuit devices may comprise a variety of structures including, for example, those based on field effect semiconducting device structures. In some such exemplary embodiments, the devices may include designs that have a gate electrode lying under, above, or at the nanocrystal layers.

Proceeding to FIG. 4, an exemplary embodiment of parallel processing flow 400, 450 that may produce complementary p and n-type Thin Film Nanocrystal Integrated Circuit devices is illustrated. In some embodiments, the n-type process 400 and the p-type process 450 may be performed in isolation. At 410, the base material for each type of device may be a flat or planar substrate upon which the devices may be formed. In some "bottom gate" electrode-type process embodiments, at step 415, a metallic or conductive material may be deposited to form an isolated gate electrode. In some embodiments, the gate electrode may be screened deposited from a sputtered or evaporated source. Other methods may include blanket deposition followed by patterned etching processes.

In some embodiments, at 420, a gate dielectric layer may be deposited to cover and surround the gate electrode. An exemplary method for said deposition may be to spin on the dielectric from a liquid precursor followed by a curing process. In other embodiments, the dielectric may be deposited by vapor deposition, and in some cases subsequently planarized by a technique such as, for example, chemical mechanical polishing. In other embodiments, a seed film of aluminum oxide may be grown in select regions by features, for example those comprising gold, which may block the growth except in the selected region. In some embodiments, atomic layer deposition processing may allow the selective growth of a quality dielectric film, such as, for example, an aluminum oxide atomic layer, in specific regions.

In some embodiments of n-type processing at 400, at 425, the n-type Thin Film Nanocrystal Integrated Circuit layer may be deposited upon the dielectric layer. This deposition may be regionally controlled by masked deposition of sprayed forms of the Thin Film Nanocrystal Integrated Circuit. In other embodiments, a blanket film may be applied followed by a patterned removal process. An exemplary material for the n-type layer may include, for example, CdSe nanocrystals, which may be interbound through ligands, such as thiocyanate. In some embodiments, the exemplary layer may be doped by indium. In some embodiments of ambipolar devices, the n-type Thin Film Nanocrystal Integrated Circuit film may be deposited on the dielectric layer at 425, and the n-type layer may be covered by p-type Thin Film Nanocrystal Integrated Circuit material at 430. In other embodiments, as illustrated, p-type processing 450 may not include a deposition of an n-type layer at 425.

In some p-type embodiments, at step 430, a p-type Thin Film Nanocrystal Integrated Circuit layer may be deposited upon the dielectric layer. This deposition may be regionally controlled by masked deposition of vapor phase forms of the Thin Film Nanocrystal Integrated Circuit. In other embodiments, a blanket film may be applied followed by a patterned removal process. In some embodiments, n-type processing 400 may not include a deposition of a p-type layer at 430. The p-type layer may include CuSe nanocrystals, for example. Alternatively, the p-type layer may comprise an organic semiconductor layer, which may include, for example, pentacene, tetracene, rubrene, and regioregular poly(3-hexylthiophene) (P3HT). It may be apparent to one ordinarily skilled in the art that other materials may comprise acceptable n and p-type organic TFT devices and nanocrystal TFT devices, which may be consistent within the scope of the art herein.

At 435 and 436, electrodes 461, 462 may be placed on the formative Thin Film Nanocrystal Integrated Circuit transistor device. As illustrated, the electrode placement at 435 for the n-type process may be separate from the electrode placement at 436 for the p-type process. In some embodiments, the placement of the electrodes 461, 462 at 435, 436 may occur simultaneously. There may be numerous means to form the source/drain electrodes including screened deposition from a sputtered or evaporated source. Other methods may include blanket deposition followed by patterned etching processes. Any method of forming isolated conductive electrode structures may be consistent with the art herein.

In some embodiments, at 440 and 441, insulator may be placed to encapsulate the source/drain electrodes or the entire device. An exemplary method of deposition may include spinning on the dielectric from a liquid precursor followed by a curing process. In other embodiments, the dielectric may be deposited by vapor deposition, and in some implementations, the dielectric may be planarized by a technique such as chemical mechanical polishing. In some embodiments, following the deposition of the insulator layer, contact openings 463 may be formed, such as through laser ablation processing or lithography imaged subtractive etching processes.

Figure 5:
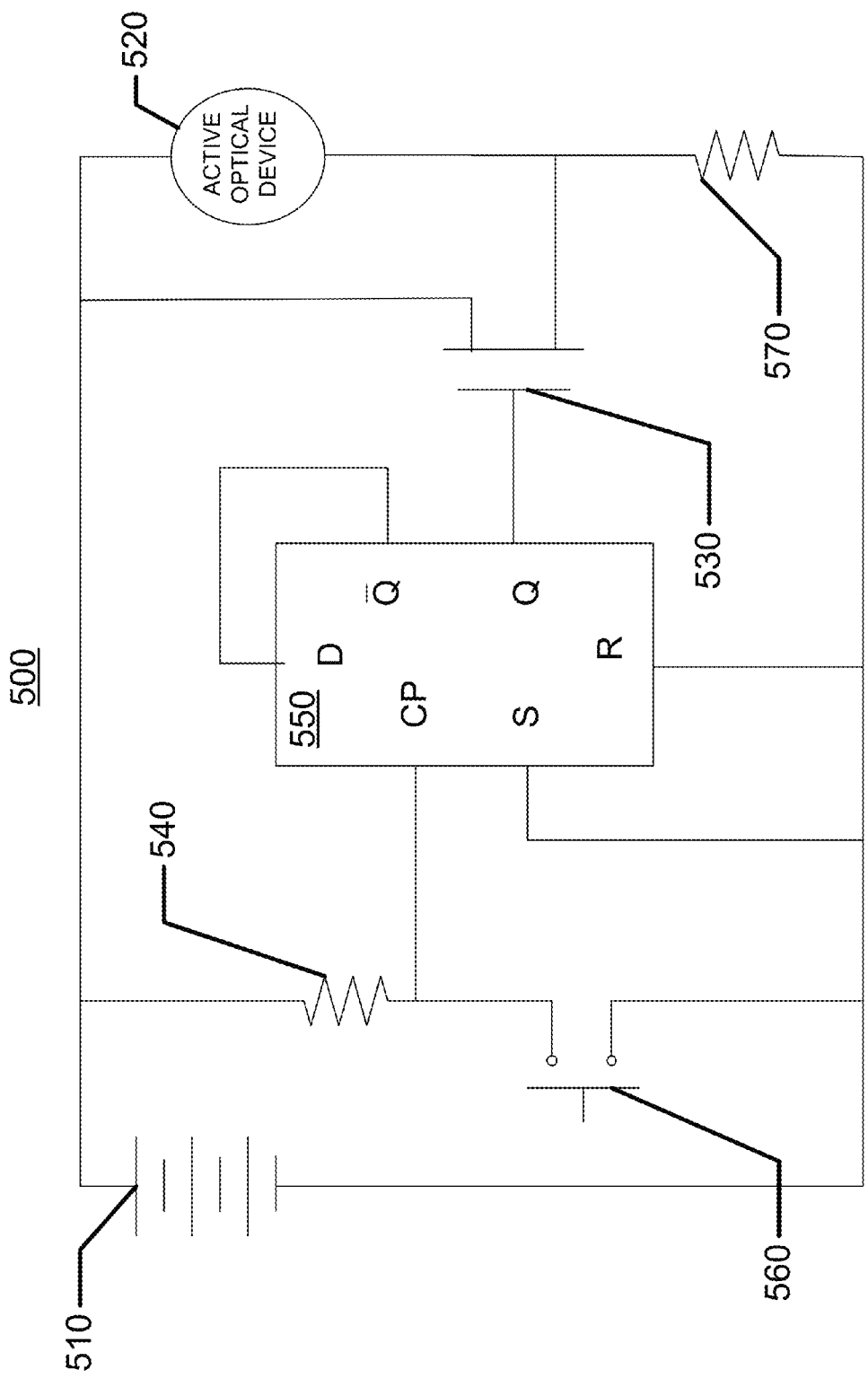
FIG. 5 illustrates an exemplary electronic circuit function utilizing Thin Film Nanocrystal Integrated Circuits that may be included in an Ophthalmic Device.

An Example of an Ophthalmic Embodiment Utilizing Thin Film Nanocrystal Integrated Circuit Transistors Proceeding to FIG. 5, an exemplary electronic circuit 500 consistent with an of an ophthalmic embodiment where an energization element may respond to a mechanical switch as an activation device and may apply electrical potential when activated across an active Ophthalmic Device including a meniscus-based focusing element.

An energization element 510 may energize circuits that may contain Thin Film Nanocrystal Integrated Circuit transistors, and in some embodiments, the energization element 510 may be comprised of various and numerous battery cells connected in a series manner. As an example, cells may be connected to generate an electrical potential in the energization element of approximately 20 Volts. Other embodiments may include more or less cells connected together to generate energization potentials ranging from approximately 10 Volts to 100 volts.

The energization element 510 may apply its potential across an active ophthalmic element 520. In some embodiments, the active optical element 520 may be a meniscus lens based device that may respond by changing the shape of a meniscus based on the application of potential across two immiscible fluids. In some embodiments of a meniscus lens based devices, the device may function essentially as an extremely high impedance capacitor, from an electrical perspective. Therefore, the energization element 510 may initially charge the active optical element 520 through a resistive element 570. When the potential fully charges the capacitive element, the energization element 510 may not have a large dissipative load on it. In embodiments with more complex circuitry, start-up circuitry may be defined to further ensure that the energization element 510 may not be discharged.

The electronic circuit 500 may further include a "D-Flip-Flop" circuit, based on a circuit using the complementary n and p-type Thin Film Nanocrystal Integrated Circuit transistors. The D-FlipFlop 550 may have its D and Q (not) outputs connected together, and the Set (s) and Reset (R) may be connected to ground. The output of Q may then flip from one state to the next when there is a voltage level change at the Clock (CP) input. That input may be set by the energization element 510, through a resistive element 540.

When an external switch 560 may be activated, such as where a user exerts pressure onto a pressure switch, the potential at CP may be brought close to ground, and this level change may toggle the state of the D-FlipFlop 550. When the level changes at Q, a transistor 530 connected thereto may be "Turned-On" and may conduct across the active optical element 520 effectively shorting the active optical element 520 and allowing a change in the active optical state. Numerous designs of flip-flop circuits may function in similar manners as described with a D-FlipFlop circuit 550 with multiple methods of activating and controlling the status of the exemplary circuit 500.

Figure 6:
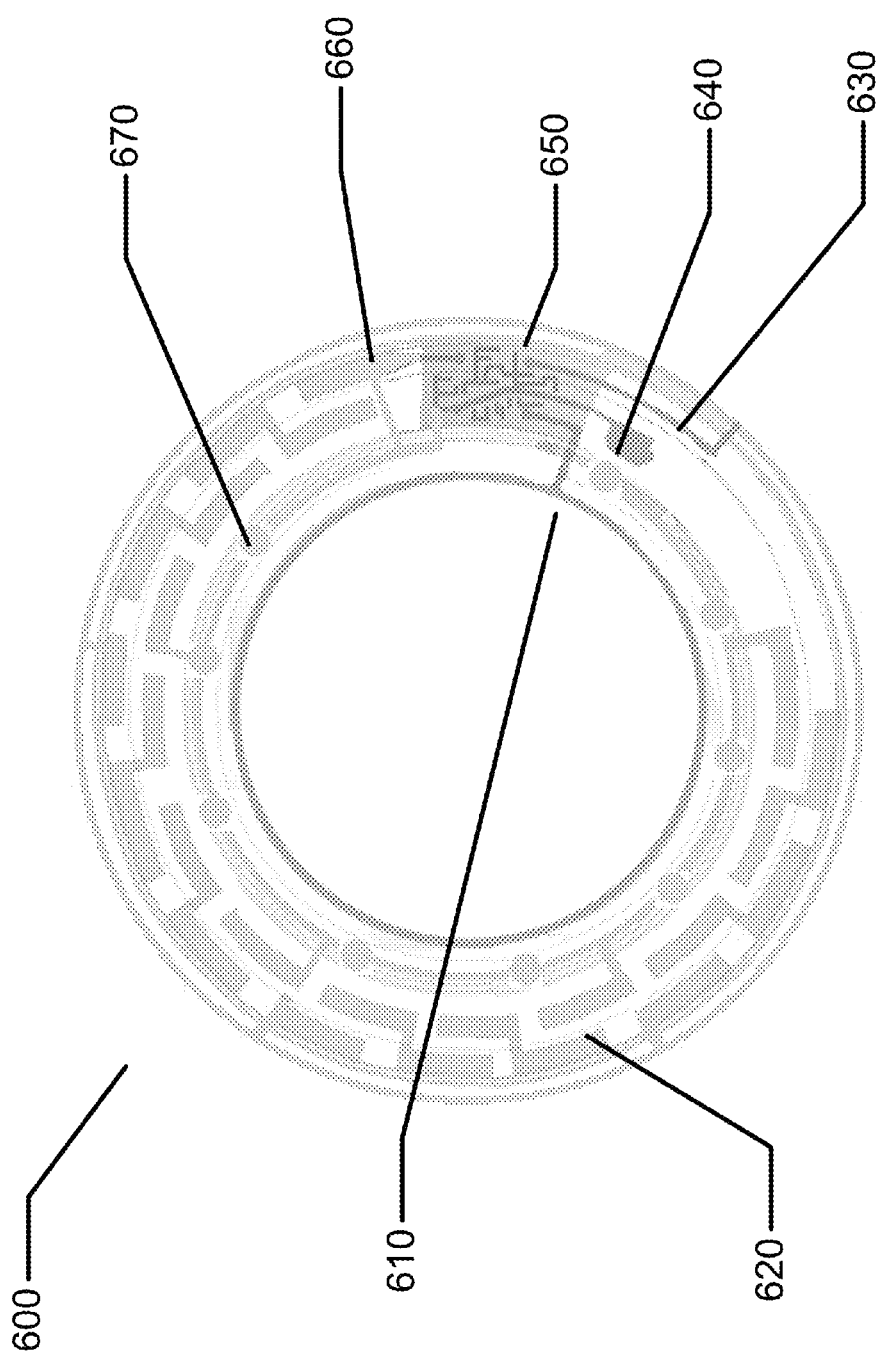

Proceeding to FIG. 6, an exemplary embodiment of an Insert Piece that may be consistent with the circuit embodiment illustrated in FIG. 5 is illustrated. In some embodiments, a connection point 610 may allow for electrical communication between the meniscus lens and the circuit. Some embodiments may include multiple energization cells 620 connected in series in order to generate the necessary potentials required for operation of Thin Film Nanocrystal Integrated Circuit based circuits. In some such embodiments, the series of energization cells 620 may define an energization element of approximately 5 volts, for example. The energization element may include two contacts 630, 640.

In some embodiments, a D-Type FlipFlop circuit 650 may comprise multiple circuit components, such as, for example, those illustrated in FIG. 5. The D-Type Flip Flop circuit 650 may contain both n and p-type Thin Film Nanocrystal Integrated Circuit transistors and the resistive elements 540 and 570. In some embodiments, a second contact 660 may define an alternative connection point for the meniscus lens.

Some embodiments may include a pressure-sensitive switch 670 or membrane switch that may be formed from spaced metallic traces that may complete a contact between the two sides when the switch 670 is deflected by pressure. In some embodiments, the D-Type FlipFlop circuit 650 may include additional circuit elements, which may provide a debounce function or a time-delayed debounce function for the action of the described activation device. Other activation devices, such as hall-effect devices, may provide equivalent switching function to that described.

Specific examples have been described to illustrate aspects of inventive art relating to the formation, methods of formation, and apparatus of formation that may be useful to form energization elements upon electrical interconnects on Three-dimensional Surfaces. These examples are for said illustration and are not intended to limit the scope in any manner. Accordingly, the description is intended to embrace all embodiments that may be apparent to those skilled in the art.

CONCLUSION

The present invention, as described above and as further defined by the claims below, provides methods and apparatus to form Thin Film Nanocrystal Integrated Circuit transistors upon Three-dimensionally Formed Insert Pieces. In some embodiments, the present invention includes incorporating the Three-dimensional Surfaces with Thin Film Nanocrystal Integrated Circuit based thin film transistors, electrical interconnects, and energization elements into an Insert Piece for incorporation into Ophthalmic Device. In some embodiments, the Insert Piece may be directly used as a Media Insert or incorporated into an Ophthalmic Device.

The invention claimed is:

1. An ophthalmic device comprising:
   a first media insert comprising an active optical device, a first thin film nanocrystal transistor, a first energization element and a first conductive trace, wherein the first thin film nanocrystal transistor comprises an n-type nanocrystal layer, wherein the first energization element is proximate to the first conductive trace so that the first energization element is in electrical communication with the first thin film nanocrystal transistor, wherein the active optical device comprises a liquid meniscus lens element having two immiscible fluids forming a meniscus therebetween, wherein the active optical device is in electrical communication with the first energization element and the first thin film nanocrystal transistor, and wherein the active optical device is configured to change the focal characteristics of the ophthalmic device upon application of an electrical charge to change the shape of the meniscus; and
   a hydrogel material surrounding or encapsulating the first media insert.

2. The ophthalmic device of claim 1, wherein the first thin film nanocrystal transistor comprises a p-type nanocrystal layer.

3. The ophthalmic device of claim 1, wherein the first conductive trace comprises a transparent electrode.

4. The ophthalmic device of claim 1, wherein the first energization element comprises a plurality of electrochemical cells, wherein the electrochemical cells are in connection at least in part in a series.

5. The ophthalmic device of claim 1, wherein the first media insert further comprises an activation element in electrical communication with the active optical device.

6. The ophthalmic device of claim 1, wherein the n-type nanocrystal layer comprises cadmium selenide nanocrystals.

7. The ophthalmic device of claim 1, wherein the first media insert further comprises a second thin film transistor comprising a second nanocrystal layer, wherein the second thin film transistor is in electrical communication with the first energization element.

8. The ophthalmic device of claim 2, wherein the p-type nanocrystal layer comprises copper selenide.

9. The ophthalmic device of claim 3, wherein the transparent electrode comprises indium tin oxide.

10. The ophthalmic device of claim 5, wherein the activation element comprises a pressure sensitive switch.

11. The ophthalmic device of claim 7, wherein the second thin film transistor comprises a p-type nanocrystal layer.

12. The ophthalmic device of claim 11, wherein the p-type nanocrystal layer of the second thin film transistor comprises copper selenide.

13. The ophthalmic device of claim 7, additionally comprising a
second media insert comprising:
a second energization element;
a second conductive trace; and
a third thin film transistor comprising an organic semiconductor layer, wherein the second conductive trace is capable of placing the second energization element in electrical communication with the third thin film transistor.

14. The ophthalmic device of claim 13, wherein the third thin film transistor comprises an n-type nanocrystal layer.

15. The ophthalmic device of claim 14, wherein the n-type nanocrystal layer comprises cadmium selenide nanocrystals.

16. The ophthalmic device of claim 13, additionally comprising a fourth thin film transistor, wherein the fourth thin film transistor comprises a p-type organic semiconductor layer.

17. The ophthalmic device of claim 16, wherein the p-type organic semiconductor layer comprises pentacene.

18. The ophthalmic device of claim 1, wherein the first media insert has a three-dimensional topography.

19. The ophthalmic device of claim 1, wherein the first energization element is configured to energize a circuit that includes the first thin film nanocrystal transistor and a second thin film transistor, the first thin film nanocrystal transistor comprising an n-type nanocrystal layer and the second thin film transistor comprising a p-type nanocrystal layer.

20. The ophthalmic device of claim 19, wherein the circuit is configured to permit the ophthalmic device to turn on and off.

21. The ophthalmic device of claim 1, wherein the first thin film nanocrystal transistor comprises a gate electrode, a nanocrystal layer, a gate dielectric layer between the gate electrode and the nanocrystal layer, a source electrode in contact with the nanocrystal layer, and a drain electrode in contact with the nanocrystal layer.

22. An ophthalmic device comprising:
a first media insert having a three-dimensional surface, wherein first the media insert comprises at least a first thin film nanocrystal transistor, a first energization element and a first conductive trace, wherein the first thin film nanocrystal transistor comprises a n-type nanocrystal layer, and wherein the first energization element is proximate to the first conductive trace so that it is in electrical communication with the first thin film nanocrystal transistor; and
a hydrogel material surrounding or encapsulating the first media insert.

23. The ophthalmic device of claim 22, wherein the first thin film nanocrystal transistor comprises a p-type nanocrystal layer.

24. The ophthalmic device of claim 22, wherein the first conductive trace comprises a transparent electrode.

25. The ophthalmic device of claim 22, wherein the first energization element comprises a plurality of electrochemical cells, wherein the electrochemical cells are in connection at least in part in a series.

26. The ophthalmic device of claim 22, wherein the first media insert additionally comprises an active optical device capable of changing the focal characteristics of the ophthalmic device, wherein the active optical device is in electrical communication with the first energization element.

27. The ophthalmic device of claim 26, wherein the active optical device comprises a liquid meniscus lens element having two immiscible fluids forming a meniscus therebetween, and wherein the active optical device is configured to change the focal characteristics of the ophthalmic device upon application of an electrical charge to change the shape of the meniscus.

28. The ophthalmic device of claim 26, wherein the first media insert further comprises an activation element in electrical communication with the active optical device.

29. The ophthalmic device of claim 22, wherein the n-type nanocrystal layer comprises cadmium selenide nanocrystals.

30. The ophthalmic device of claim 22, wherein the first media insert additionally comprises a second thin film transistor comprising a second nanocrystal layer, wherein the second thin film transistor is in electrical communication with the first energization element.

31. The ophthalmic device of claim 24, wherein the transparent electrode comprises indium tin oxide.

32. The ophthalmic device of claim 28, wherein the activation element comprises a pressure sensitive switch.

33. The ophthalmic device of claim 30, wherein the second thin film transistor comprises a p-type nanocrystal layer.

34. The ophthalmic device of claim 33, wherein the p-type nanocrystal layer of the second thin film transistor comprises copper selenide.

35. The ophthalmic device of claim 30, additionally comprising a second media insert comprising:
a second energization element;
a second conductive trace; and
a third thin film transistor comprising an organic semiconductor layer, wherein the second conductive trace is capable of placing the second energization element in electrical communication with the third thin film transistor.

36. The ophthalmic device of claim 35, wherein the third thin film transistor comprises an n-type nanocrystal layer.

37. The ophthalmic device of claim 36, wherein the n-type nanocrystal layer comprises cadmium selenide nanocrystals.

38. The ophthalmic device of claim 37, additionally comprising a fourth thin film transistor, wherein the fourth thin film transistor comprises a p-type organic semiconductor layer.

39. The ophthalmic device of claim 38, wherein the p-type organic semiconductor layer comprises pentacene.

* * * * *